United States Patent [19]

Shintaku

[11] 4,385,211

[45] May 24, 1983

[54] REFLEX HORN SPEAKER WITH A WATERPROOFING DEVICE

[75] Inventor: Yoshishige Shintaku, Osaka, Japan

[73] Assignee: Ibuki Kogy Co., Ltd., Japan

[21] Appl. No.: 206,140

[22] Filed: Nov. 12, 1980

[30] Foreign Application Priority Data

May 28, 1980 [JP] Japan .................................. 55-71009

[51] Int. Cl.$^3$ .............................................. H05K 5/00

[52] U.S. Cl. .................... 179/115.5 H; 179/115.5 BS; 181/149

[58] Field of Search ................. 179/115.5 H, 115.5 E, 179/115.5 BS; 181/152, 149, 156, 194

[56] References Cited

U.S. PATENT DOCUMENTS

Re. 23,724 10/1953 Seabert ............................... 181/149

2,290,968 7/1942 Iglück ................................ 181/149

2,981,359 4/1961 Carlisle .............................. 181/194

3,260,990 7/1966 Massa ................................ 181/149

4,071,111 1/1978 Croup ................................ 181/149

*Primary Examiner*—G. Z. Rubinson

*Assistant Examiner*—L. C. Schroeder

*Attorney, Agent, or Firm*—Schwartz & Weinrieb

[57] ABSTRACT

A reflex horn speaker with a waterproofing device for use on a ship or the like is disclosed. The reflex horn speaker comprising a sound generator, an inner cylindrical horn, a conical reflector concentrically arranged around the inner horn, and an outer cylindrical horn concentrically arranged around the reflector, is provided with a waterproofing device such as a valve, mounted to the closed front end of the reflector, which can open or close the front opening of the inner horn in order to prevent water and/or moisture from coming in the inner horn when it is not used.

7 Claims, 2 Drawing Figures

REFLEX HORN SPEAKER WITH A WATERPROOFING DEVICE

BACKGROUND OF THE INVENTION

This invention relates to a reflex horn speaker with a waterproofing device.

A reflex horn speaker generally comprises a sound generator comprising a voice coil and a diaphragm connected thereto, an inner cylindrical horn of relatively small diameter which projects frontward from the front face of the sound generator, a conical reflector with a closed front end of rather larger diameter than that of the inner horn, which is concentrically arranged around the inner horn with a certain space therebetween, and an outer cylindrical horn which extends outer frontward and is concentrically disposed around the reflector.

This type of reflex horn speaker has in recent times found frequent application as on ships. When it is used on ships, water and/or moisture come in the inner horn from the front end thereof and effect a reduction in sound quality. Also water and/or moisture may penetrate from gaps in the diaphragm plate and proceed into the voice coil, as a result, the voice coil becomes corroded and deteriorates or it shortcircuits due to heat damage and frequently becomes inferior condition or completely useless.

SUMMARY OF THE INVENTION

Therefore, it is an object of the present invention to provide a reflex horn speaker with a waterproofing device free from the aforementioned defects, which is simple in construction, stable and reliable, and is economical.

According to the present invention there is provided a reflex horn speaker comprising a sound generator, an inner cylindrical horn of relatively small diameter, which projects frontward from the front of the sound generator, a conical reflector having a closed front end of larger diameter than that of the inner horn, which is concentrically disposed around the inner horn with a certain space therebetween, and an outer cylindrical horn which extends outer frontward and is concentrically disposed around the conical reflector, characterized by a waterproofing device mounted to the front end of the conical reflector, which can open or close the front opening of the inner cylindrical horn.

BRIEF DESCRIPTION OF DRAWINGS

In order that the present invention may be better understood preferred embodiments will now be described with reference to the accompanying drawings, in which.

DESCRIPTION OF PREFERRED EMBODIMENTS

Figure 1:
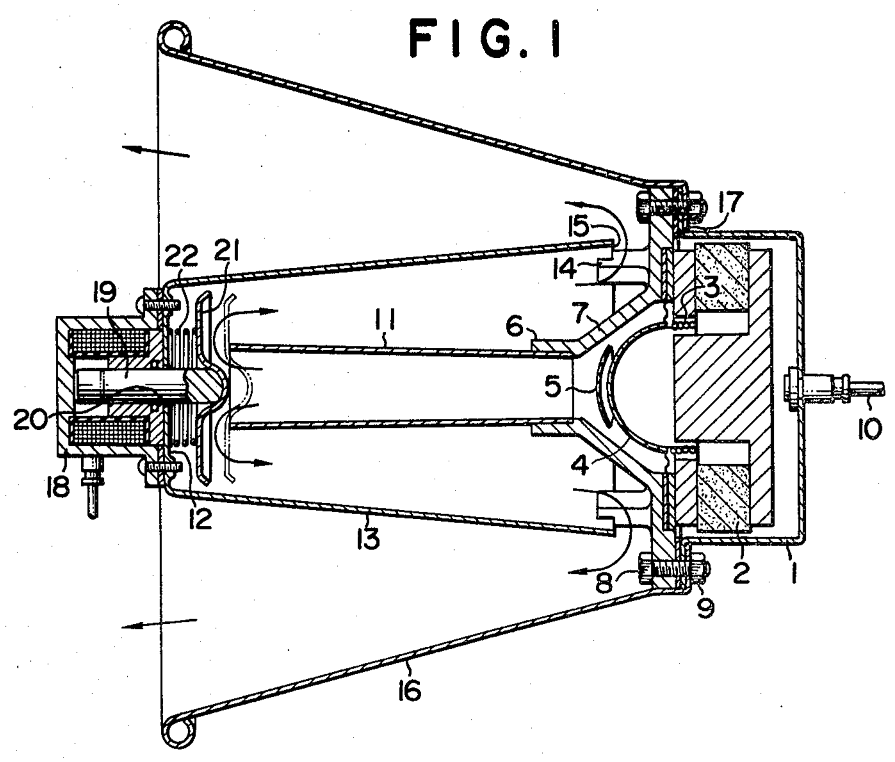
FIG. 1 is a central longitudinal cross section of a reflex horn speaker according to the present invention.

Referring now to the drawings there is shown in FIG. 1 one embodiment of a reflex horn speaker according to the present invention.

In a box member 1 having a front opening, from its back a magnet 2, a voice coil 3, a diaphragm 4 and an equalizer 5 are arranged. To the front opening of the box member 1 a conical cover plate 7 equipped with a cylinder tube 6 in its front center is mounted to a flange portion of the box member 1 by means of bolts 8 and nuts 9.

In this way, as is well known, when the magnet 2 is intermittently activated by an electric current via a cable 10, the diaphragm 4 is oscillated, thereby producing a sound.

The rear end of an inner cylindrical horn 11 of relatively small diameter is inserted into the cylinder tube 6 of the cover plate 7.

The inner horn 11 is concentrically surrounded with a certain space by a conical reflector 13 whose front end is closed off by a blocking plate 12, of larger diameter than that of the inner horn 11. The free rear end of the reflector 13 is supported by a cylindrical flange 14 secured to the front surface of the cover plate 7. The cylindrical flange 14 is perforated with a plenty of holes 15 through which the sound emitted passes.

The reflector 13 is concentrically surrounded with ample space by an outer cylindrical horn 16 extending outer frontward. The outer cylindrical horn 16 is provided with a rear end flange 17 extending inward, which is mounted to the cover plate 7 and the flange of the box member 1 by the bolts 8 and the nuts 9.

A solenoid valve 18 is mounted to the front face of the blocking plate 12 of the reflector 13. An actuating rod 19 of the solenoid valve 18 extends rearward through a hole 20 formed in the center of the blocking plate 12. A valve plate 21 is mounted to the free end of the actuating rod 19. A coil spring 22 is placed in position between the blocking plate 12 and the valve plate 21 and thus the spring 22 biases the valve plate 21 rearward so that the valve plate 21 may close the front end of the inner horn 11.

In this embodiment, when the solenoid valve 18 is not actuated, the valve plate 21 closes the front end of the inner horn 11 by the force of the spring 22. Then, when the solenoid valve 18 is actuated, the rod 19 and thus the valve plate 21 are moved frontward against the force of the spring 22, thereby opening the front end of the inner horn 11.

In this case, the magnet 2 and the solenoid valve 18 are preferably activated or deactivated in the same time.

When the magnet 2 and the solenoid valve 18 are actuated, the sound produced by the diaphragm 4 is transmitted through the inner horn 11, the reflector 13, the holes 15 of the flange 14 and the outer horn 16, as shown by arrows in FIG. 1, and then is emitted frontward from the outer horn 16.

When the sound is not being produced, both the magnet 2 and the solenoid valve 18 are deactivated, so that the valve plate 21 may close the front end of the inner horn 11.

Thus, with this invention, the front end of the inner horn 11 is only opened at times when the sound is being produced. Normally, i.e. during the vast majority of the time, the front end of the inner horn 11 is kept closed by the valve plate 21. Therefore, the possibility that sea water or other moisture will come into the front end of the inner horn 11 and cause such damage mentioned hereinbefore can be reduced largely in comparison with a conventional reflex horn speaker, such as on the order of one in tens or one in hundreds chances.

This invention, however, can be realized by applying only a simple device to a conventional reflex horn speaker, which has the advantage of completing at a low cost.

Figure 2:
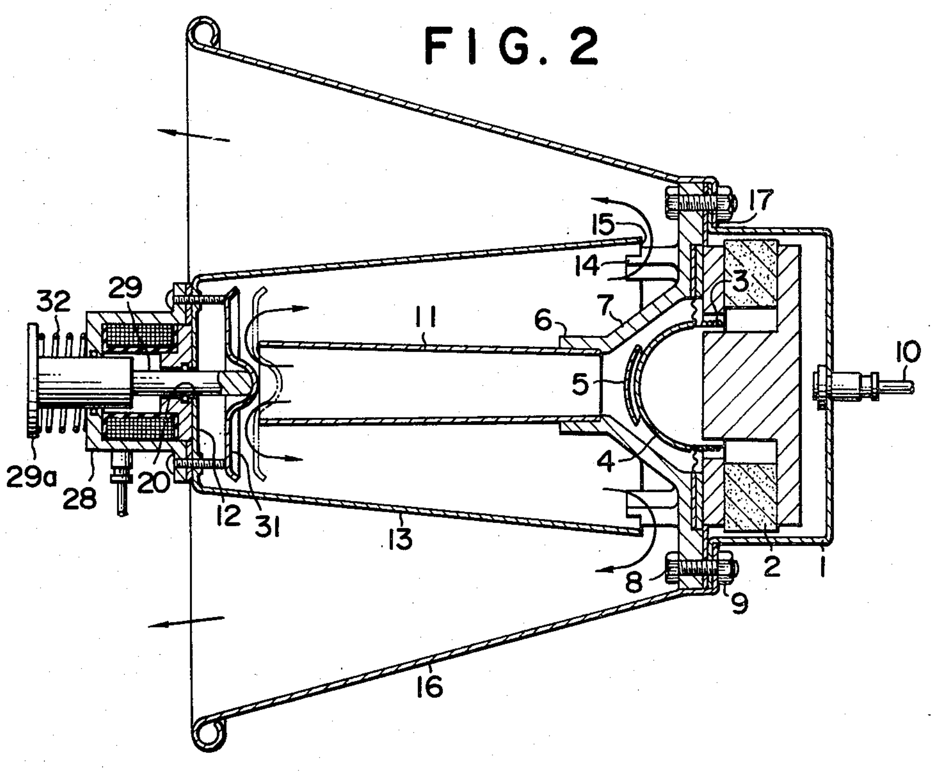
FIG. 2 is a central longitudinal cross section of another reflex horn speaker according to the present invention.

In FIG. 2 there is shown another embodiment of a reflex horn speaker according to the present invention.

The construction of the second embodiment of the present invention is almost the same as that of the first embodiment shown in FIG. 1, except a solenoid valve 28, and hence the explanations of the same members as those in FIG. 1 are omitted.

In this embodiment, when the solenoid valve 28 is not actuated, the front end of the inner horn 11 is opened. An actuating rod 29 extends rearward through the blocking plate 12 and also frontward. To the rear end and the front end of the actuating rod 19 are mounted a valve plate 31 and a stop plate 29*a*, respectively. A coil spring 32 is positioned between the blocking plate 12 and the front stop plate 29*a*, and accordingly the spring 32 biases the actuating rod 29 and the valve plate 31 frontward so that the valve plate 31 may open the front end of the inner horn 11 when the solenoid valve 28 is not actuated.

In this embodiment the magnet 2 and the solenoid valve 28 can be activated or deactivated alternately by a simple switching device through which less amount of current flows, which means the saving energy and thus economic.

According to the present invention, of course, a valve which is driven by a motor, is also used instead of a solenoid valve.

Although the present invention has been described with reference to preferred embodiments thereof, illustrated in the accompanying drawings, however, various changes and modifications can be made by those skilled in the art without departing from the scope of the present invention.

What is claimed is:

1. A reflex horn speaker comprising:

a sound generator;

an inner cylindrical horn of relatively small diameter, which projects frontward from the front of the sound generator;

a conical reflector having a closed front end of larger diameter than that of the inner horn, which is concentrically disposed around the inner horn with a certain space therebetween; and an outer cylindrical horn which extends outer frontward and is concentrically disposed around the conical reflector, wherein the improvement comprises a waterproofing device mounted to the front end of the conical reflector, which can open or close the front opening of the inner cylindrical horn, said waterproofing device being a solenoid valve.

2. A horn speaker as defined in claim 1, wherein, while the sound generator is actuated, the front opening of the inner horn is opened.

3. A horn speaker as defined in claim 2, wherein the valve is driven by a motor.

4. A horn speaker as defined in claim 3, wherein when the valve is activated, it opens the front opening of the inner horn.

5. A horn speaker as defined in claim 3, wherein when the valve is deactivated, it opens the front opening of the inner horn.

6. A horn speaker as defined in claim 4, wherein the valve is activated as well as the sound generator is activated.

7. A horn speaker as defined in claim 5, wherein the valve is deactivated, as well as the sound generator is activated.

* * * * *